(12) United States Patent
Kang et al.

(10) Patent No.: US 12,206,002 B2
(45) Date of Patent: Jan. 21, 2025

(54) SEMICONDUCTOR DEVICE WITH DEEP TRENCH ISOLATION MASK LAYOUT

(71) Applicant: SK keyfoundry Inc., Cheongju-si (KR)

(72) Inventors: Yang Beom Kang, Cheongju-si (KR); Sang Uk Lee, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 302 days.

(21) Appl. No.: 17/560,465

(22) Filed: Dec. 23, 2021

(65) Prior Publication Data
US 2022/0384595 A1 Dec. 1, 2022

(30) Foreign Application Priority Data
May 27, 2021 (KR) .................. 10-2021-0068438

(51) Int. Cl.
*H01L 29/423* (2006.01)
*G03F 1/36* (2012.01)
(Continued)

(52) U.S. Cl.
CPC ........... *H01L 29/4238* (2013.01); *G03F 1/36* (2013.01); *H01L 27/092* (2013.01); *H01L 29/7817* (2013.01)

(58) Field of Classification Search
CPC ........... H01L 21/764; H01L 21/823878; H01L 21/823871; H01L 21/761; H01L 21/76237; H01L 21/76224; H01L 27/092; H01L 27/0623; H01L 27/0922; H01L 27/088; H01L 27/04; H01L 27/12; H01L 29/0653; H01L 29/0696; H01L 29/66659; H01L 29/0649; H01L 29/4238; H01L 29/66681; H01L 29/7816; H01L 29/7817; H01L 29/7835; H01L 29/78; H01L 29/7811; H01L 21/762; H01L 21/823412; H01L 21/823481; H01L 21/823493; H01L 21/76283; H01L 21/823418; H01L 21/04; H01L 21/20; H01L 29/66674;
(Continued)

(56) References Cited

U.S. PATENT DOCUMENTS

| 9,355,209 B2 | 5/2016 | Chuang et al. |
| 2005/0025351 A1* | 2/2005 | Kotani ................ G03F 1/84 382/144 |

(Continued)

FOREIGN PATENT DOCUMENTS

| KR | 10-2015-0114378 A | 10/2015 |
| KR | 10-1867755 B1 | 6/2018 |
| KR | 10-2020-0125873 A | 11/2020 |

OTHER PUBLICATIONS

Korean Office Action issued on Oct. 31, 2022, in counterpart Korean Patent Application No. 10-2021-0068438 (6 pages in Korean).

*Primary Examiner* — Natalia A Gondarenko
(74) *Attorney, Agent, or Firm* — NSIP Law

(57) ABSTRACT

A deep trench layout implementation for a semiconductor device is provided. The semiconductor device includes an isolation film with a shallow depth, an active area, and a gate electrode formed in a substrate; a deep trench isolation surrounding the gate electrode and having one or more trench corners; and a gap-fill insulating film formed inside the deep trench isolation. The one or more trench corners is formed in a slanted shape from a top view.

10 Claims, 15 Drawing Sheets

(51) Int. Cl.
*H01L 27/092* (2006.01)
*H01L 29/78* (2006.01)

(58) Field of Classification Search
CPC ............. H01L 29/7801; H01L 29/0852; H01L 29/7846; H01L 29/7848; H01L 29/404; H01L 29/402; H01L 29/41741; H01L 29/7395; H01L 29/408; H01L 29/42368; H01L 29/872; H01L 29/861; H01L 29/8083; H01L 29/02; H01L 29/06; H01L 29/0619–0623; H01L 29/0634; H01L 29/0692; H01L 29/0886; H01L 29/66719; H01L 29/7393; H01L 29/7823; H01L 29/7827; G03F 1/36; G03F 7/70441; G06F 17/50
USPC ........ 257/400, 403, 337, 341, 343; 438/437; 716/19, 52, 53
See application file for complete search history.

(56) References Cited

U.S. PATENT DOCUMENTS

| | | | |
|---|---|---|---|
| 2010/0146476 A1* | 6/2010 | Huang | G03F 7/70441 |
| | | | 716/51 |
| 2011/0220914 A1* | 9/2011 | Fujii | H01L 29/0615 |
| | | | 257/493 |
| 2012/0104564 A1* | 5/2012 | Won | H01L 21/308 |
| | | | 257/E21.548 |
| 2013/0326434 A1* | 12/2013 | Feng | G03F 1/70 |
| | | | 716/52 |
| 2015/0021687 A1* | 1/2015 | Tamura | H01L 29/06 |
| | | | 438/424 |
| 2015/0069509 A1* | 3/2015 | Lee | H01L 29/66659 |
| | | | 257/343 |
| 2015/0102452 A1* | 4/2015 | Kamibaba | H01L 29/66712 |
| | | | 257/488 |
| 2016/0372429 A1* | 12/2016 | Cho | H01L 21/84 |
| 2018/0151410 A1* | 5/2018 | Usami | H01L 21/764 |
| 2022/0384636 A1* | 12/2022 | Edwards | H01L 29/66681 |

* cited by examiner

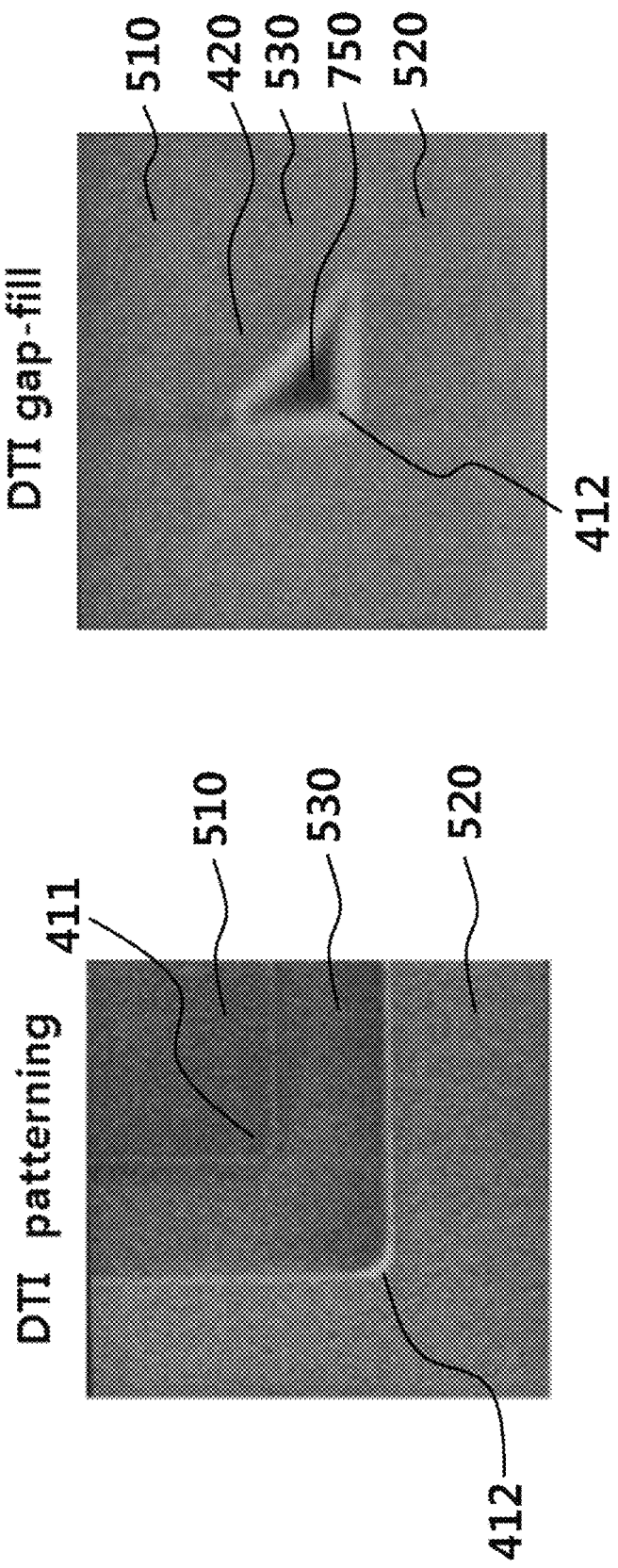

SEMICONDUCTOR DEVICE WITH DEEP TRENCH ISOLATION MASK LAYOUT

CROSS-REFERENCE TO RELATED APPLICATION(S)

This application claims the benefit under 35 U.S.C. § 119 of Korean Patent Application No. 10-2021-0068438 filed on May 27, 2021, in the Korean Intellectual Property Office, the entire disclosure of which is incorporated herein by reference for all purposes.

BACKGROUND

1. Field

The following disclosure relates to a semiconductor device with a deep trench isolation mask layout.

2. Description of Related Art

In the process of manufacturing semiconductor devices, it is beneficial that the semiconductor devices are manufactured with a smaller form factor. Accordingly, the size of semiconductor chips has recently been reduced. It is important to form many elements inside a semiconductor chip. However, it is also important to isolate elements from each other. Junction isolation (JI) is frequently used in high voltage semiconductor devices. However, a JI method may utilize too much space in the chip. Accordingly, a deep trench isolation (DTI) method may be implemented.

However, when a gap-fill is carried out with an insulating film in a DTI structure, a void is formed because an insulating film is not filled in a corner area of the DTI structure. Additionally, a metal residue may occur in the void, thereby causing faults in the product.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a semiconductor device fabrication method includes preparing a first layout for the semiconductor device, wherein the first layout comprises a first active region, a second active region and an isolation region disposed between the first active region and the second active region, wherein the isolation region comprises an inner corner and an outer corner that are respectively disposed adjacent to the first active region and the second active region, and wherein the outer corner is spaced apart from the inner corner by a first diagonal length; revising the first layout for the semiconductor device via an optical proximity correction (OPC) process, to generate a second layout that comprises a revised isolation region with a revised outer corner with a slanted line connecting two adjacent lines, wherein the slanted line is spaced apart from the inner corner by a second diagonal length; and fabricating the semiconductor device based on the generated second layout.

The OPC process may include adding an assist feature to the outer corner.

The assist feature may have a triangular shape.

Each of the inner corner and the outer corner of the isolation region in the first layout has a sharp angle, and wherein the sharp angle is 90 degrees; wherein the OPC process further comprises converting the sharp angle of the outer corner to a tilted angle of the outer corner with respect to the two adjacent lines, and wherein the tilted angle is 45 degrees.

The fabricating of the semiconductor device may include patterning the revised isolation region such that the revised isolation region includes: a rounded inner corner that corresponds to the inner corner in the first layout; and a slanted outer corner that corresponds to the outer corner in the first layout.

The first layout may include a plurality of closed loop gate electrodes which overlap the first active region, and wherein at least one of the closed loop gate electrodes has an opening region and a slanted gate corner.

The slanted gate corner of the at least one of the closed loop gate electrodes may have a same direction as a direction of the slanted outer corner of the second layout.

The OPC process may include generating a rectangle with slanted corners in the isolation region; wherein the length of the second diagonal may be less than the length of the first diagonal after the fabricating of the semiconductor device.

The fabricating of the semiconductor device may include forming a photoresist layer with an inner rounded corner and a slanted outer corner, and the photoresist layer may be patterned based on the revised corner.

In a general aspect, a semiconductor device includes a gate layout configured to form a gate electrode; and an isolation layout configured to form a deep trench isolation which surrounds the gate electrode, wherein the isolation layout comprises: a first active region overlapped with the gate electrode; a second active region spaced from the gate electrode; and an isolation region disposed between the first active region and second active region, and wherein the isolation region includes an inner corner closer to the closed loop gate electrode; and a slanted outer corner, such that the isolation region has a rectangular with the slanted outer corner.

An optical proximity correction process (OPC) may be applied to the isolation layout to form the isolation region with the slanted outer corner.

The gate electrode may have a slanted gate corner, and the slanted outer corner of the isolation region may have a same direction as a direction of the slanted gate corner of the gate electrode.

The gate electrode may have a closed loop shape, and the semiconductor device is a Bipolar-CMOS-DMOS device (BCD).

The inner corner of the isolation region in the isolation layout may have a sharp angle, and the sharp angle may be 90 degrees.

In a general aspect, a semiconductor device includes a substrate; a gate electrode, formed on the substrate; a shallow trench isolation structure disposed in the substrate; and a deep trench isolation structure, comprising a side wall insulating film and a gap-fill insulating film, wherein the deep trench isolation structure is configured to include at least one first trench corner with a curved shape.

At least one second trench corner may have a slanted shape.

The gate electrode may have configured to have a closed-loop form, and an active area is formed in an open area of the gate electrode.

An angle of the slanted shape of the second trench corner may be 45 degrees.

Other features and aspects will be apparent from the following detailed description, the drawings, and the claims.

BRIEF DESCRIPTION OF DRAWINGS

FIGS. 1C and 1D illustrate SEM images of a portion of an example semiconductor device 500 at various stages of fabrication, in accordance with one or more embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
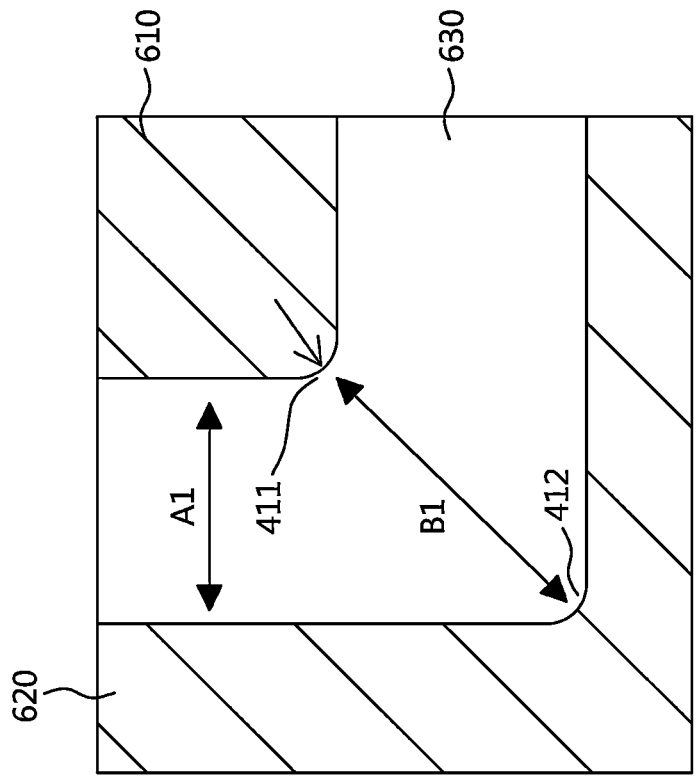
FIGS. 1A and 1B illustrate various simplified conceptual top views of a portion of an example semiconductor device at various stages of fabrication, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of the application, may be omitted for increased clarity and conciseness.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include varies in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

The disclosure may solve problems related to the above technical issue, and provides a deep trench layout for a semiconductor device including a deep trench region where a corner is removed by cutting a corner region of a deep trench.

A targeted problem of the disclosure is not limited by the problems which are mentioned above, and other problems may be understood by a person skilled in the relevant art, from the following description.

The examples relate to a deep trench isolation layout method for semiconductor devices that may improve a deep trench gap-fill.

The detailed description of the disclosure is given below, with attached drawings.

A layout design may be used to create a photo mask. Through the production of multiple photo masks, a semiconductor device may be formed. Instead of the term 'layout design', a layout design, IC design, IC layout (Integrated circuit layout) may be used. IC design, IC layout (Integrated circuit layout) indicates an operation among a design process of a semiconductor integrated circuit, and may mean a process of drawing a mask pattern used to implement a circuit on a wafer.

Thus, by implementing a layout design, it is possible to make an active mask, a shallow trench isolation (STI) mask, a gate mask, a N-type well (NW)/P-type well (PW) mask, a deep trench isolation (DTI) mask, etc. Additionally, a layout design may be a layout including a mask tooling operation.

Additionally, a layout may be implemented by a system such as, but not limited to, such as Graphic Design System (GDS). First, after designing an integrated circuit, all of active and passive components and an inter-connection wire may be arranged, and a GDSII bit file may be created in some computer programs to produce them. In a produced chip, a plan view (horizontal direction) and a cross-sectional view (vertical direction) are illustrated. A layout may normally include a figure only for a plan view (or layout view) comprising multiple layers from a substrate to a top metal.

The following operations may be implemented until a mask is produced. An operation of functional verification may be implemented. A functional verification operation confirms an integrity of an operation according to a change of surrounding conditions by adding a parasitic component to Netlist extracted from a physical layout.

Next a physical verification operation may be performed. The physical verification operation may confirm whether a physical layer layout, whose integrity is verified, is suitable for a process standard.

Next, a mask tooling operation may be performed. A mask tooling operation is an operation that is desirable to create a mask, such as Optical Proximity Correction (OPC), Dummy generation, Frame/PG Work etc. An OPC process may be included in the mask tooling operation. A mask may be produced through a mask producing operation. When a mask is produced, IC, a semiconductor device, a semiconductor chip etc. may be formed in a fabrication process.

The examples may change a DTI layout design in mask tooling operations using an OPC. First, a layout where a physical verification is completed may be implemented as a basically provided layout. Then, a mask tooling operation may be executed with a basically provided layout. By implementing an OPC and correcting a trench corner, a mask may be produced with a revised layout, and a semiconductor device may be produced.

In an example, if a layout design where a physical verification is completed is called GDSI, a layout design that is completed through an OPC procedure may be called GDSII. In a GDSII operation, a determination may be made whether a DTI mask corner is formed in a slanted shape or not. It may be easier to understand the description below pertaining to this operation.

In an example, a mask may be defined as a tool including a pattern that is used to create an entire wafer with a single exposure.

Figure 1B:
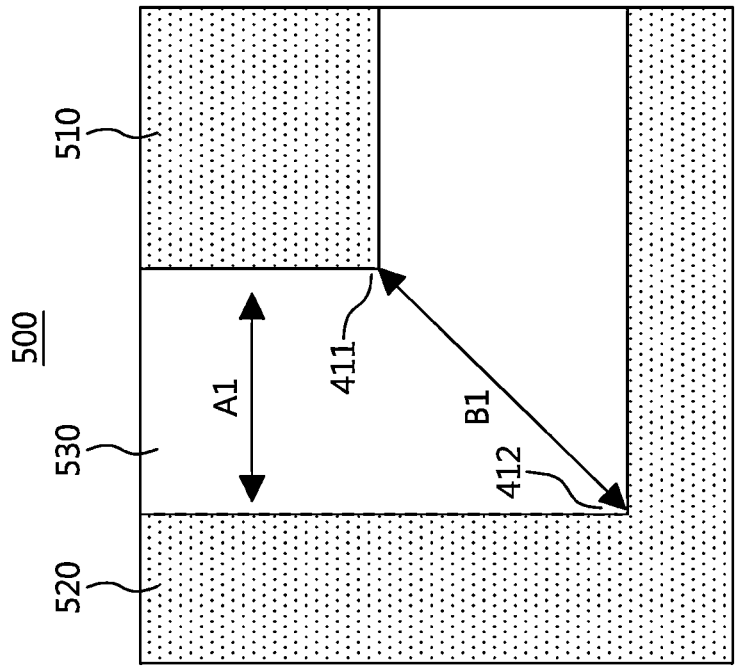

FIGS. 1A and 1B illustrate various simplified conceptual top views of a portion of an example semiconductor device 500 at various stages of fabrication, in accordance with one or more embodiments.

Referring to FIG. 1A, a simplified diagrammatic original layout of the portion of the semiconductor device 500 is illustrated. According to the original layout, the portion of the semiconductor device 500 includes a first active region 510, a second active region 520, and an isolation region 530 disposed between the first active region 510 and the second active region 520. A deep trench isolation may be formed in the isolation region 530. The isolation region 530 may include an inner corner 411 and an outer corner 412. The inner corner 411 and the outer corner 412 have sharp angles. In an example an angle of the inner corner 411 and the outer corner 412 may be approximately 90 degrees. Thus the inner corner 411 and the outer corner 412 may be respectively called an angular inner corner and an angular outer corner.

In an example, the isolation region 530 may have a width 'A1' (a width in a horizontal dimension) which is a distance between the first active region 510 and the second active region 520. The isolation region 530 may also have a first diagonal length 'B1' which is a distance between the inner corner 411 and the outer corner 412. In an example, the first diagonal length 'B1' may be much greater than a width 'A1'. In an example, a first diagonal length 'B1' may be over 150% of the width 'A1'.

Referring to FIG. 1B, a simplified diagrammatic top view of the portion of the example semiconductor device 500 is illustrated. At the stage of fabrication illustrated in FIG. 1B, photoresist layers 610 and 620 may be formed to define the active regions 510 and 520. In other words, the photoresist layers 610 and 620 may be formed to have approximately the same geometries as the active regions 510 ad 520 illustrated in the original layout of FIG. 1A, so that the photoresist layers 610 and 620 may be used in a subsequent patterning process to accurately define the active regions 510 and 520. However, due to various photolithography effects, the photoresist layers 610 and 620 as formed may not accurately resemble the active regions 510 and 520 in the original layout as illustrated in FIG. 1A. In an example, the photoresist layers 610 and 620 as formed have rounded corners 411 and 412, rather than the sharp corners 411 and 412 illustrated in the original layout (FIG. 1A).

FIGS. 1C and 1D are SEM images of a portion of a semiconductor device 500 at various stages of fabrication. FIG. 1C illustrates a SEM image of the portion of the semiconductor device 500 after performing a deep trench isolation etching process. The active regions 510 and 520 also have the rounded corners 411 and 412 that are present in the photoresist layers 610 and 620. The isolation region 530 may be formed by the deep trench isolation etching process.

FIG. 1D illustrates a SEM image of the portion of the example semiconductor device 500 after a deep trench isolation gap-fill process. A gap-fill insulating film 420 may be formed in the isolation region 530. During the deep trench isolation gap-fill process, the isolation region 530 near outer corner 412 may not be filled with the gap-fill insulating film 420, thus resulting in the formation of a void 750. Due to the long diagonal length 'B1', the isolation region may not be sufficiently filled with the gap-fill insulating film 420. During the semiconductor manufacturing process, a metal residue may remain in the void 750. The void 750 may adversely impact device performance, and it is therefore undesirable.

Figure 2A:
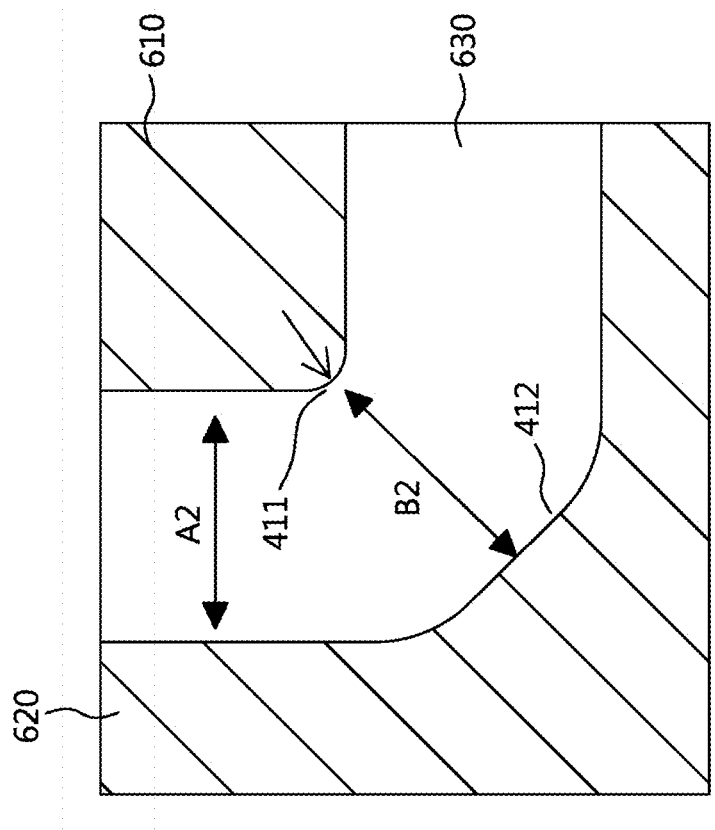
FIGS. 2A and 2B illustrate various simplified conceptual top views of a portion of an example semiconductor device at various stages of fabrication, in accordance with one or more embodiments.
Figure 2B:
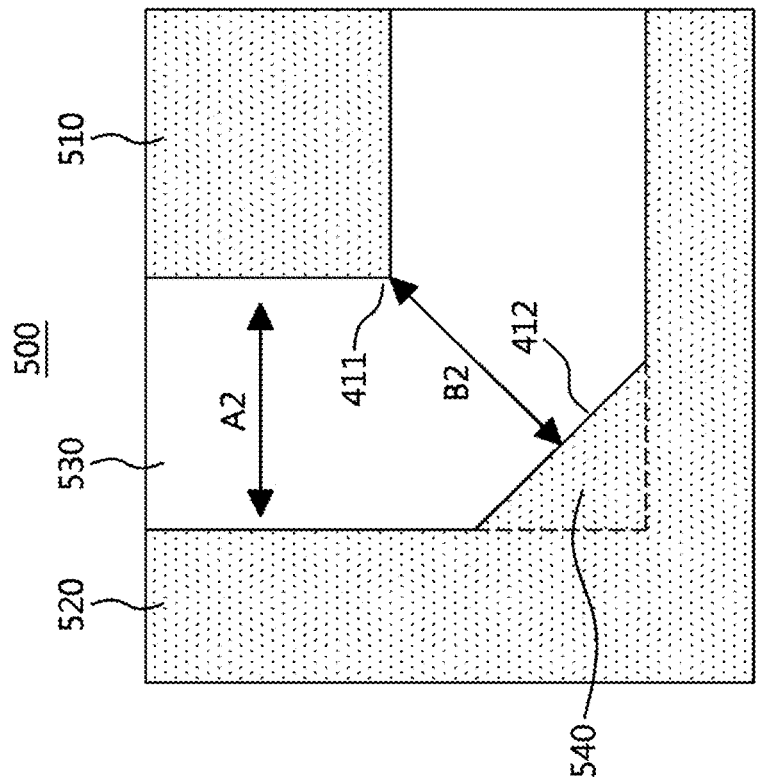

FIGS. 2A and 2B are various simplified conceptual top views of a portion of an example semiconductor device 500 at various stages of fabrication, in accordance with one or more embodiments.

Referring to FIG. 2A, a simplified top view of a revised layout is illustrated for the portion of the semiconductor device 500 having a revised second active region 520. In the revised layout, the first active region 510 may remain substantially the same as it was in the original layout. The inner corner 411 may have a sharp angle, for example an angle that is approximately 90 degrees.

On the other hand, the layout for the second active region 520 may be modified (from the original layout shown in FIG. 1A) to shrink the long diagonal length 'B1' discussed above. The outer corner 411 may have a tilted angle, for example an angle that is approximately 45 degrees. The revised layout is obtained from the OPC process. Revising the original layout for the semiconductor device via an optical proximity correction (OPC) process, thereby generating a revised layout that includes a revised second active region with slanted or tilted corner. The revised outer corner may have a slanted line connecting two adjacent lines. Herein, the two adjacent lines may be perpendicular or orthogonal to each other. The slanted line 412 is spaced apart from the inner corner with a second diagonal length 'B2'. The slanted line 412 is also perpendicular or orthogonal to the diagonal direction. The OPC process comprises making a rectangle with corners that are slanted to the isolation region. The original angular outer corner 412 in the first layout may be converted into the slanted line 412 in the second layout.

In the example illustrated in FIG. 2A, an assist feature 540, such as, but not limited to, a triangle, or an assist feature with a triangular shape, may be added to the original layout of the second active region 520. The addition of the assist feature 540 makes the original outer corner 412 of the second active region 520 more "convex" (i.e., protruding more in an outward direction), which may shorten the first diagonal length 'B1', and result in a second diagonal length "B2". The isolation region 530 may become a rectangular shape with the slanted outer corner.

Since an original outer corner 412 may be slanted, a length of the second diagonal length 'B2' may be similar to a horizontal length 'A2'. During the deep trench isolation gap-filling process, the gap-fill material will be successfully filled into the deep trench isolation region 530. Thus, a void may not be formed in the deep trench isolation region 530. Accordingly, to eliminate a void that may be formed near the outer corner 412, the second diagonal length 'B2' in the isolation region 530 may be desirably 50-150% of a width 'A2' of the isolation region 530. If a width 'A2' is 1 um, it is desirable that the second diagonal length 'B2' be 0.8-1.2 um. When the second diagonal length 'B2' is over 50-150%, a diagonal length may be longer, and a space to be filled with an insulating film may be larger.

Referring to FIG. 2B, a simplified diagrammatic top view of the portion of the semiconductor device 500 is illustrated. At the stage of fabrication illustrated in FIG. 2B, photoresist layers 610 and 620 may be formed to define the original first active region 510 and the revised second active region 520. As discussed above, the rounding effect will make the corner 411 (FIG. 1A) slope inward. However, due to the presence of the assist feature 540 as shown in FIG. 2A, the as-formed photoresist layer 620 may have a slanted shape near the outer corner 412. The slanted outer corner 412 may protrude substantially outward from the second active region 520, so the new diagonal length 'B2' (FIG. 2B) is less than the original diagonal length 'B1' (FIG. 1B).

Figure 2D:
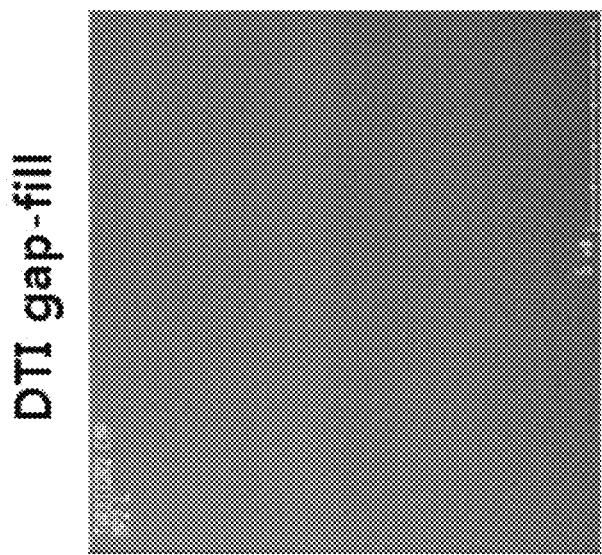
FIGS. 2C and 2D illustrate SEM images of a portion of an example semiconductor device at various stages of fabrication, in accordance with one or more embodiments.
Figure 2C:
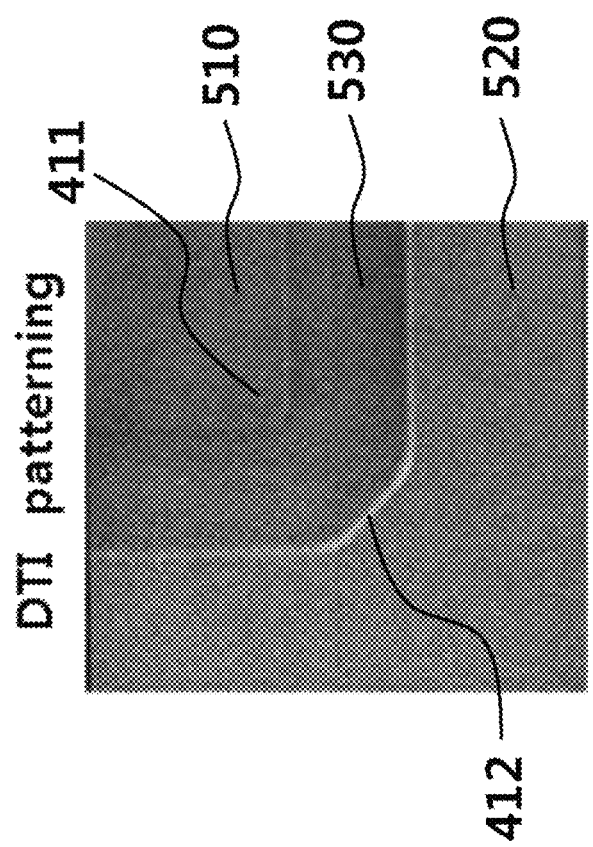

FIGS. 2C and 2D are SEM images of a portion of an example semiconductor device 500 at various stages of fabrication. FIG. 2C illustrates a SEM image of the portion of the example semiconductor device 500 after performing a deep trench isolation etching process. The first active region 510 may also have a rounded corner 411 that was present in the photoresist layers 610. However, the second active region 520 near the outer corner 412 may have a slanted shape. The isolation region 530 may have a width 'A2', and the isolation region 530 may also have a new diagonal length 'B2' between an inner corner 411 and an outer corner 412.

FIG. 2D illustrates a SEM image of the portion of the example semiconductor device 500 after a deep trench isolation gap-fill process. A gap-fill insulating film 420 (FIG. 1D) may be formed in the isolation region 530. No voids may be observed in the isolation region 530. Accordingly, by applying an OPC process to an outer corner and changing a corner into a slanted shape of approximately 45 degrees, not orthogonally, a trench corner may be obtained without a void being present near the outer edge corner of the trench. An inner corner may have a shorter radius than an outer corner, therefore, the problem may rarely occur.

Thus, the new diagonal length 'B2' may be shortened. No voids may be observed due the shortened diagonal length 'B2'. The slanted shape in the outer corner may actually be beneficial since it may reduce stress-induced high electric field that may result from sharp angles such as 90 degree angles implemented for the corners of active regions.

Figure 3A:
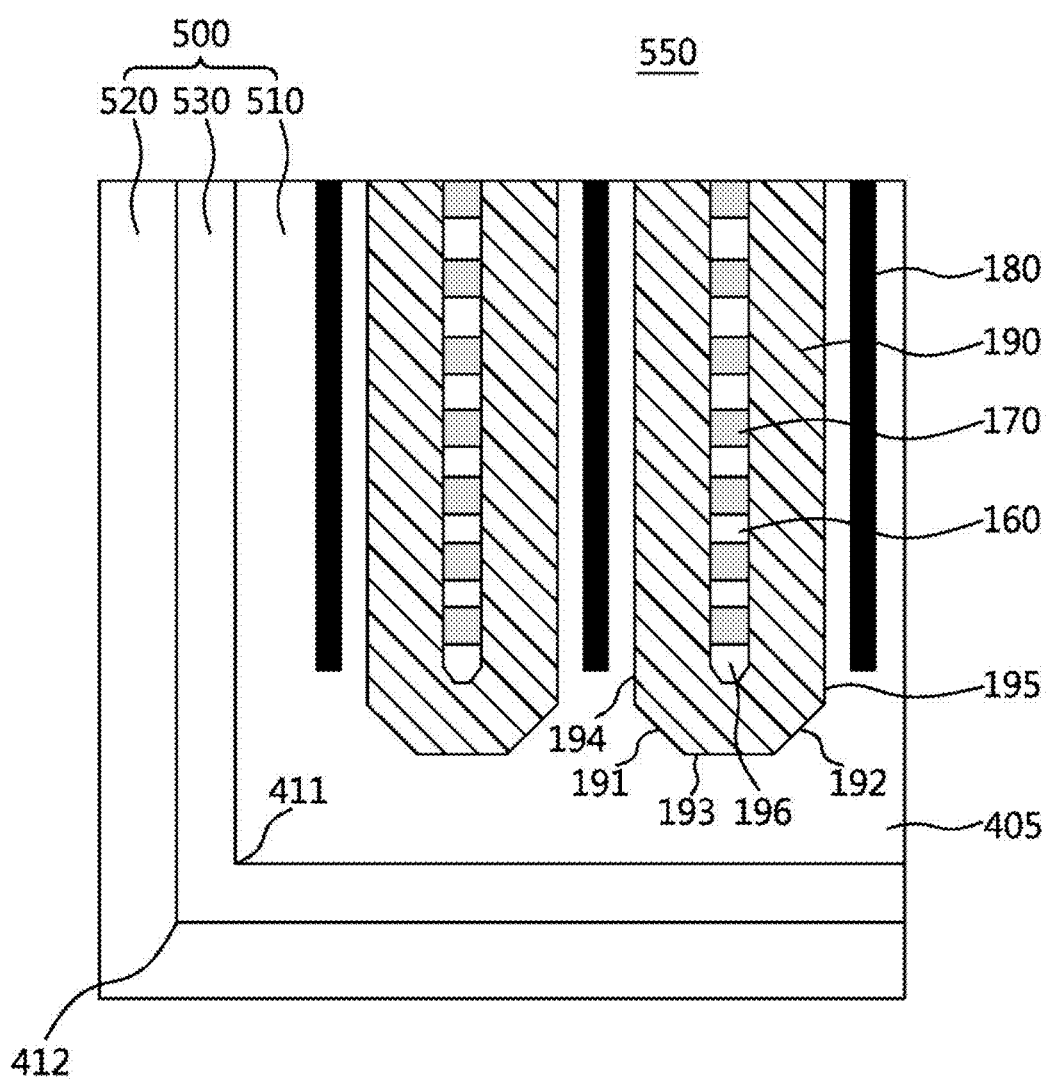
FIGS. 3A to 3C illustrate various simplified conceptual top views of a portion of an example semiconductor device at various stages of fabrication, in accordance with one or more embodiments.
Figure 3B:
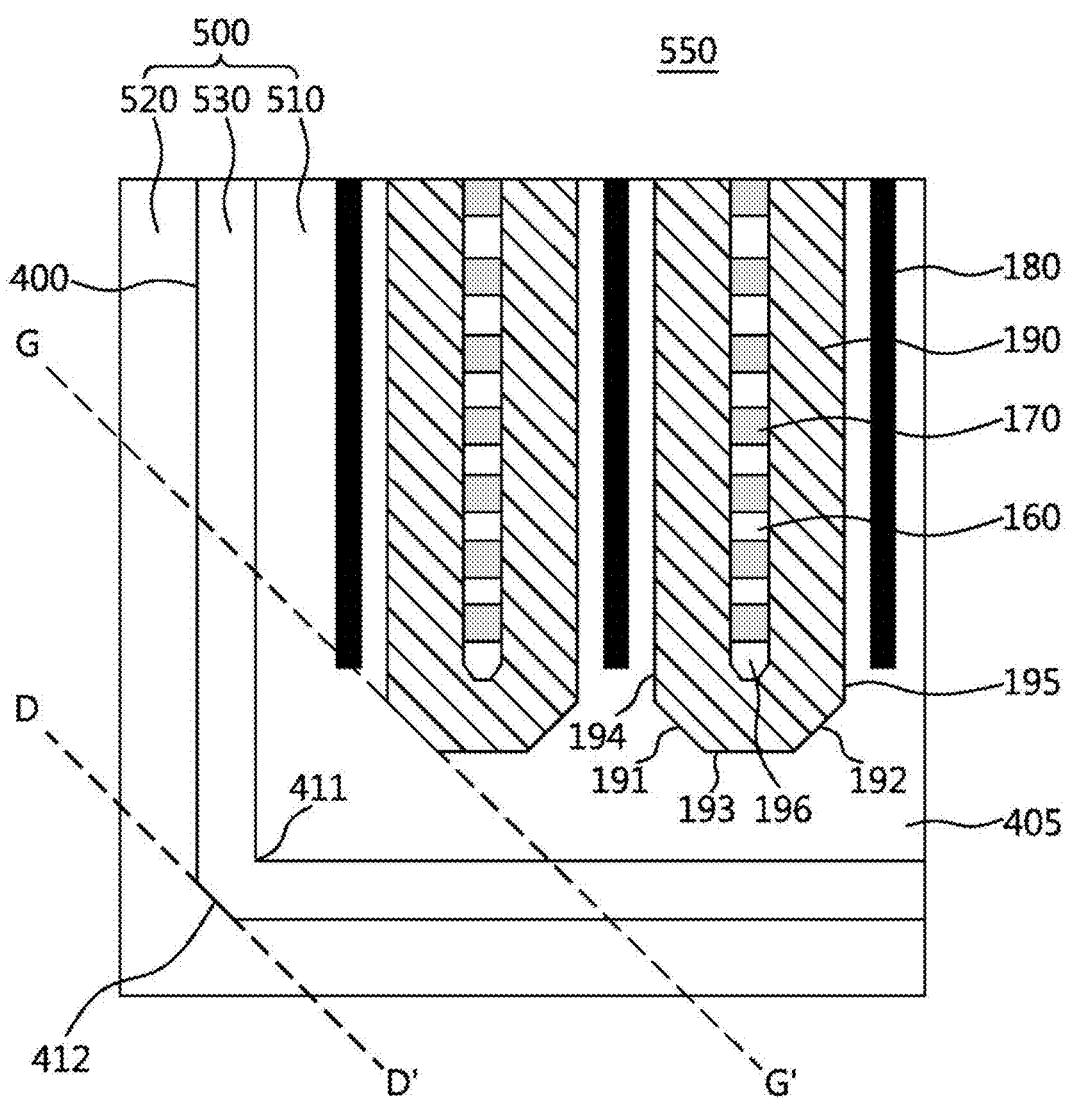
Figure 3C:
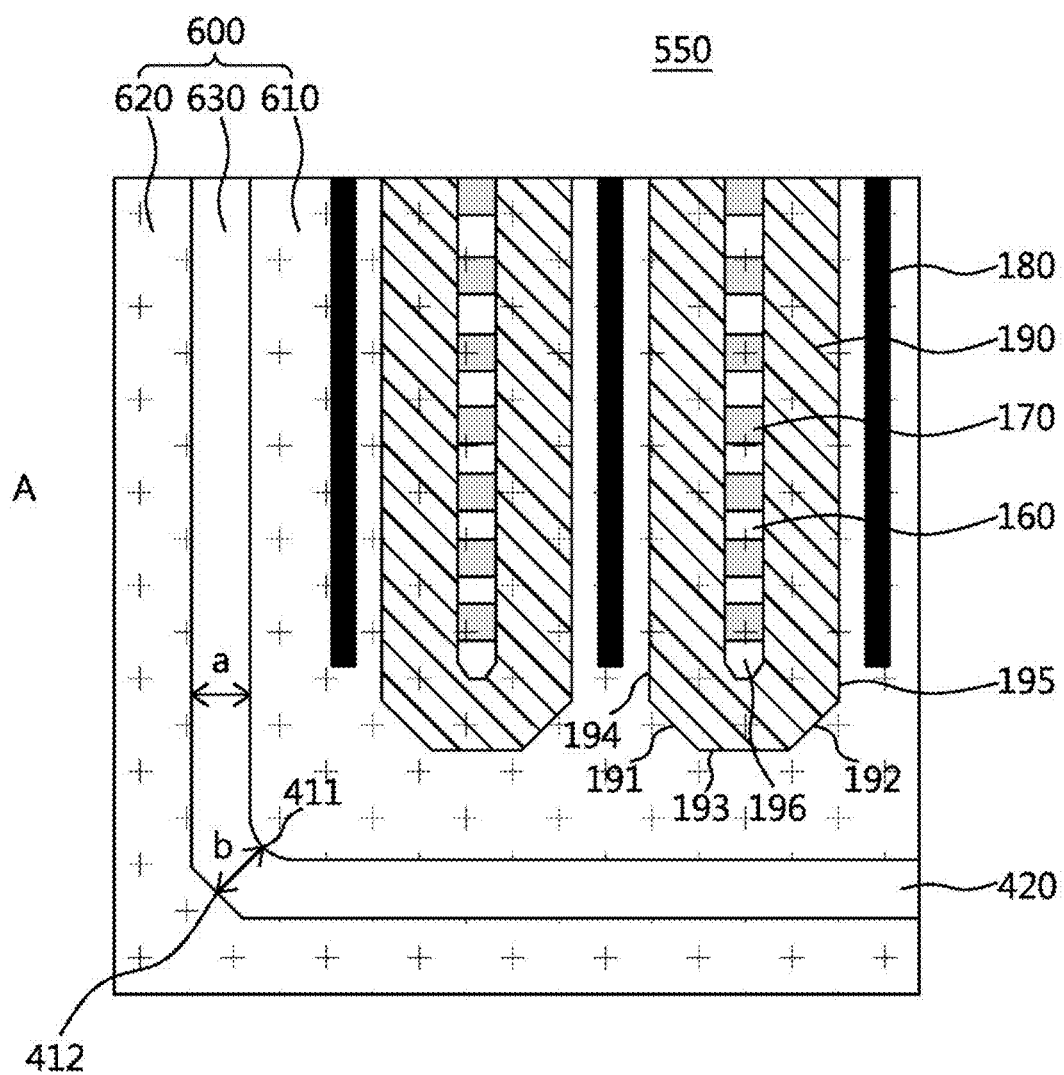

FIGS. 3A-3C illustrate various simplified conceptual top views of a portion of an example semiconductor device 550 at various stages of fabrication, in accordance with one or more embodiments.

Referring to FIG. 3A, a simplified diagrammatic original layout of the portion of the example semiconductor device 550 is illustrated. The semiconductor device 550 may be a LDMOS device.

According to the original layout, the portion of the example semiconductor device 550 includes a first active region 510, a second active region 520, and an isolation region 530 disposed between the first active region 510 and the second active region 520. A deep trench isolation may be formed in the isolation region 530. The isolation region 530 may include an inner corner 411 and an outer corner 412. The inner corner 411 and the outer corner 412 may each have sharp angles, for example an angle that is approximately 90 degrees.

The portion of the example semiconductor device 550 further includes a plurality of closed loop gate electrodes 190. The first active region 510 may be overlapped with a plurality of closed loop gate electrodes 190. However, the second active region 520 may not be overlapped with the plurality of closed loop gate electrodes 190. The inner corner 412 in the isolation region 530 may be disposed closer to the closed loop gate electrodes 190, rather than the outer corner 412.

The closed loop gate electrodes 190 may be formed with a poly-silicon material. Alternately, instead of a poly-silicon material, the closed loop gate electrode 190 may be formed as a metal gate. Each corner 191, 192 of the gate electrodes 190 may have a slanted shape, instead of a sharp shape. Additionally, a corner may be connected to each other in a short straight line 193 and toward a horizontal direction (X-axis). In an example, a first corner 191 may have a G-G' direction at an angle of 45 degrees based on a horizontal direction (X-axis). Additionally, a straight line of the gate electrodes 190 may be arranged in a vertical direction (Y-axis) (194, 195). The closed loop gate electrodes 190 may have an opening region 196 in a middle portion. The opening region 196 includes a P+ pick up region 160 and heavily-doped source regions 170. A heavily-doped doping drain region 180 may be formed at a position that is spaced apart from gate electrodes 190.

To shorten the diagonal length between the inner corner 411 and the out corner 412, an OPC process may again be employed to revise the layout of the semiconductor device 550.

Referring to FIG. 3B, a slanted outer corner 412 may be formed in order to shortened the diagonal length between the inner and outer corners 411 and 412 discussed above, similar to what was done in FIG. 2B. As a result, the deep trench isolation region 530 may be formed to have outer corner 412 that substantially protrudes outwardly, as illustrated in FIG. 3B. On the other hand, the inner corner 412 may still have a sharp angle.

An outer corner 412 in the deep trench isolation region 530 may be changed from a sharp angle to a tilted angle. This may be done in order to fill an insulating film well to the outer corner 412 in the deep trench isolation region in a gap-fill process. The outer corner 412 may have a slanted shape in the D-D' direction.

An outer corner 191 of the closed loop gate electrodes 190 may also have a slanted shape in a direction G-G' line. The D-D' and G-G' lines may have a tilted angle, for example an angle that is approximately 45 degrees. The D-D' and G-G' lines may be aligned parallel to each other. That is, a corner 191 of the closed loop gate electrodes 190 may have a slanted shape, and outer corner 412 in the deep trench isolation region 530 may also have a slanted shape, and the corner 191 of the closed loop gate electrodes 190 may have the same tilted angle as the outer corner 412 of the deep trench isolation region 530.

Both outer corner 412 of the deep trench isolation region 530, and outer corners 191 and 192 of the closed loop gate electrodes 190 may be slanted, which may actually be beneficial because it may reduce stress-induced high electric field that may result from sharp angles such as 90 degree angles for the corners of deep trench isolation region and gate electrode.

Referring to FIG. 3C, a simplified diagrammatic top view of the portion of the example semiconductor device 550 is illustrated. At the stage of fabrication illustrated in FIG. 3C, photoresist layers 610 and 620 may be formed to define the original first active region 510 and the revised second active region 520. As discussed above, the rounding effect will make the corner 411 slope inward. However, the as-formed photoresist layer 620 has slanted shape near outer corner 412. The outer corner 412 may protrude substantially outward from the second active region 520, so the new diagonal length 'b' is less than the original diagonal length 'B1'.

Photoresist layers may not be formed on the opening region 630 in which a deep trench isolation region 530 is to be formed. As previously discussed, a first active region 510, a second active region 520, and an isolation region 530 respectively correspond to a first photoresist layer 610, a second photoresist layer 620, and an opening region 630.

The first photoresist layer 610 covers the first active region 510 of the semiconductor device 550 in order not to etch the gate electrodes 190 as well as the pick-up regions, the source regions 170 and the drain regions 180 in the subsequently following deep trench isolation etching process.

A method of fabricating a semiconductor device according to various examples includes a first operation of preparing a first layout for a semiconductor device, wherein the first layout includes a first active region, a second active region and an isolation region disposed between the first active region and the second active region, and wherein the isolation region includes inner and outer corners that are disposed adjacent to the first active region and the second active region, respectively, and wherein the outer corner is spaced apart from the inner corner with a first diagonal length. The method includes a second operation of revising the first layout for the semiconductor device via an optical proximity correction (OPC) process, thereby generating a second layout that includes a revised isolation region with a revised corner that has a slanted line connecting two adjacent lines, wherein the slanted line is spaced apart from the inner corner with a second diagonal length; and The method includes a third operation of fabricating the semiconductor device based on the second layout. In some embodiments, the OPC process comprises adding an assist feature to the outer corner, and each of the inner and outer corners of the isolation region in the first layout has a sharp angle, and the OPC process further comprises converting the sharp angle of the outer corner to a tilted angle of the outer corner with respect to the two adjacent lines. In some embodiments, the fabricating comprises patterning the revised isolation region such that the revised isolation region includes a rounded inner corner that corresponds to the inner corner in the first layout, and a slanted outer corner that corresponds to the outer corner in the first layout.

In some embodiments, the first layout includes a plurality of closed loop gate electrodes that overlap the first active region, and at least one of the closed loop gate electrodes has an opening region and a slanted gate corner. In some embodiments, the slanted gate corner of the at least one of the closed loop gate electrodes may have the same direction as the slanted outer corner of the second layout. In some embodiments, after the semiconductor device has been fabricated based on the second layout, the second diagonal length may be less than the first diagonal length. The fabricating of the semiconductor device comprises forming a photoresist layer that has an inner rounded corner and a slanted outer corner, wherein the photoresist layer is patterned according to the revised corner.

Figure 4:
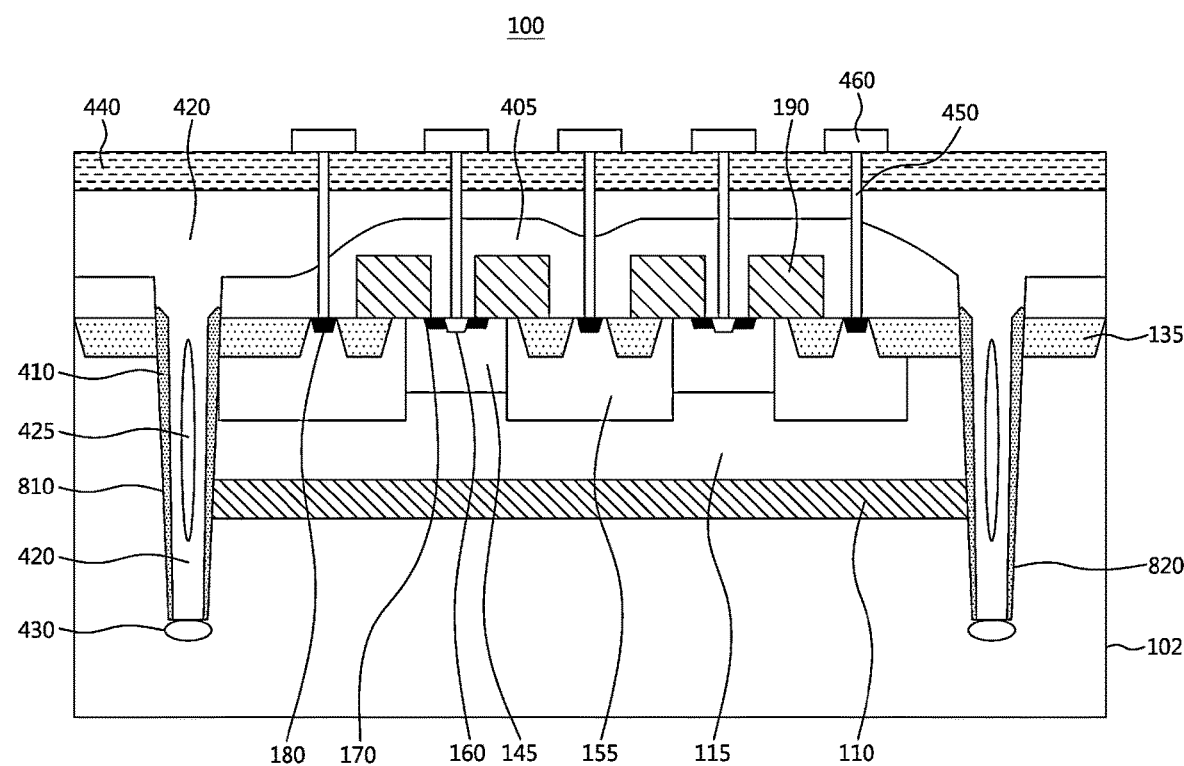
FIG. 4 illustrates an example semiconductor device, in accordance with one or more embodiments.

FIG. 4 illustrates an example structure of an example semiconductor device in accordance with one or more embodiments.

Referring to FIG. 4, an example semiconductor device in accordance with one or more embodiments includes an N-type LDMOS 100 as an array form. An N-type LDMOS 100 is surrounded by a deep trench isolation structure (DTI) 810, 820, and may be electrically separated from another adjacent element. In the example semiconductor device in accordance with one or more embodiments, a high voltage device such as a P-type LDMOS, an N-type EDMOS, a P-type EDMOS etc. may be placed other than an N-type LDMOS 100.

An N-type LDMOS 100 as an array form may include a first NBL (N-type Buried Layer) 110 formed in a P-type substrate 102, a P-type epi layer 115, a shallow trench isolation (STI) 135 implemented as an isolation film with a shallow depth, a P-type body region 145, an N-type drift region 155, a P+ pick up region 160, an N+ source region 170, an N+ drain region 180, a gate electrode 190, and a deep trench isolation structure (DTI) 810, 820. A deep trench isolation structure (DTI) 810, 820 may be called as a DTI 810, 820 or a trench isolation 810, 820 etc. The deep trench 810, 820 may include a side wall insulating film 410 formed in a deep trench, and a gap-fill insulating film 420. Other elements are explained in FIGS. 5A to 5F.

A manufacturing process of forming a shallow trench isolation (STI, 135) is performed before forming a gate electrode 190. Instead of a shallow trench isolation 135, a LOCOS oxide layer may be formed. To simplify the process, a manufacturing process of a deep trench 810, 820 may be executed after the forming of the gate electrode 190, which will be described below in FIGS. 5A to 5F. A deep trench 810, 820 may be formed by etching an insulating film that is already formed inside the shallow trench isolation 135.

FIGS. 5A to 5F illustrate an example manufacturing process of an example semiconductor device implementing a OPC applied DTI mask, in accordance with one or more embodiments.

Figure 5A:
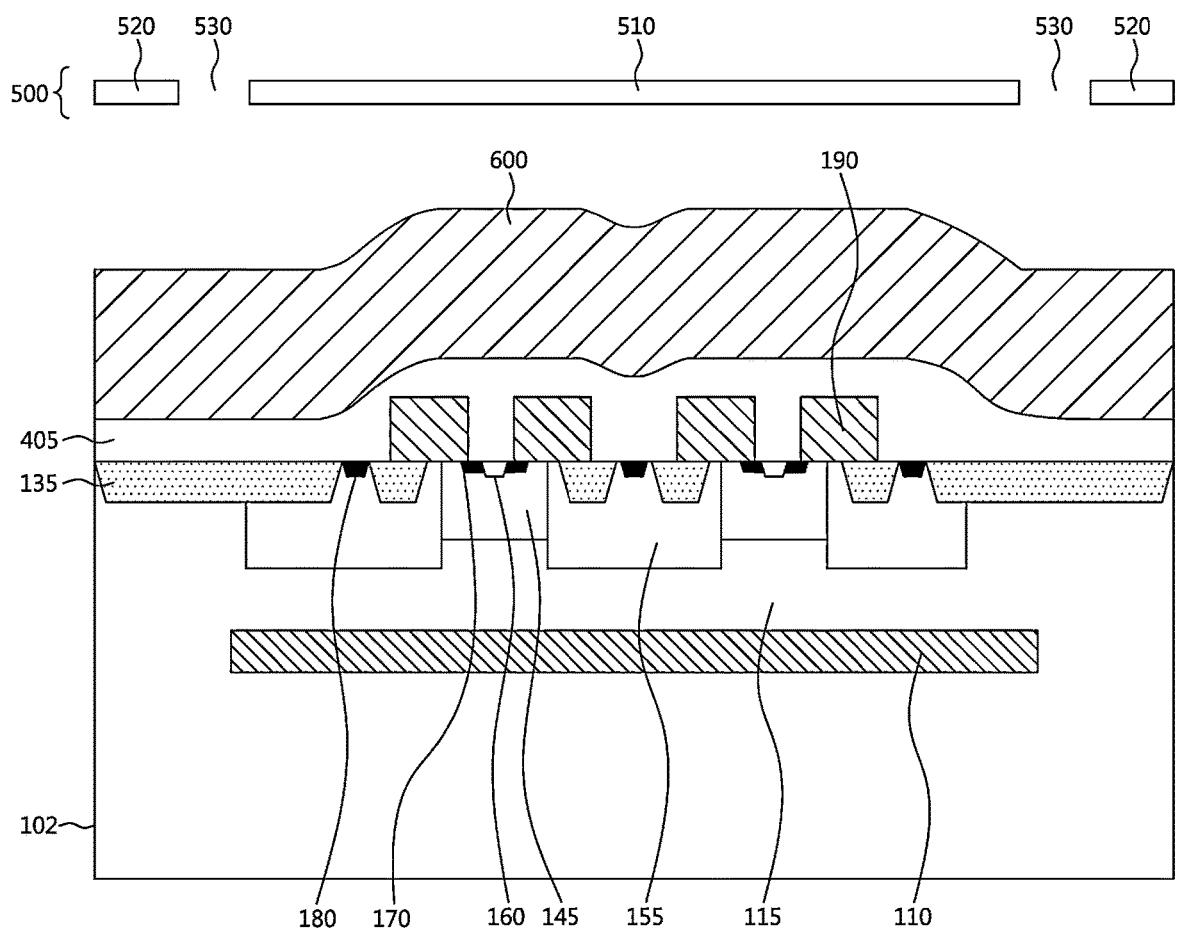
FIGS. 5A to 5F illustrate an example manufacturing process of an example semiconductor device, in accordance with one or more embodiments.

Referring to FIG. 5A, an N-type high concentration buried layer (N-type Buried Layer, NBL) 110 and a P-type epi layer 115 may be formed in a substrate 102. Additionally, a STI 135, a P-type body region 145, and an N-type drift region 155 may be formed in the epi layer 115 of a second conductivity type. A gate electrode 190, a source region 170, a drain region 180, and a pick-up region 160 may be formed on the substrate 102.

To form a DTI structure, an insulating layer 405 may be deposited on the STI, the gate electrode 190, the source region 170, the drain region 180, and the pick-up region 160. The insulating layer 405 may be formed by implementing a PECVD method with a TEOS material, as only an example. Thus, a material of the insulating layer 405 may be a PECVD oxide layer. Instead of a PECVD oxide layer, a LPCVD oxide layer may be utilized.

In order to define the deep trench isolation region in the substrate 102, a photoresist layer 600 is formed on the insulating layer 405. After coating the photoresist layer 600, the wafer having the substrate 102 is moved to a lithography process.

Figure 5B:
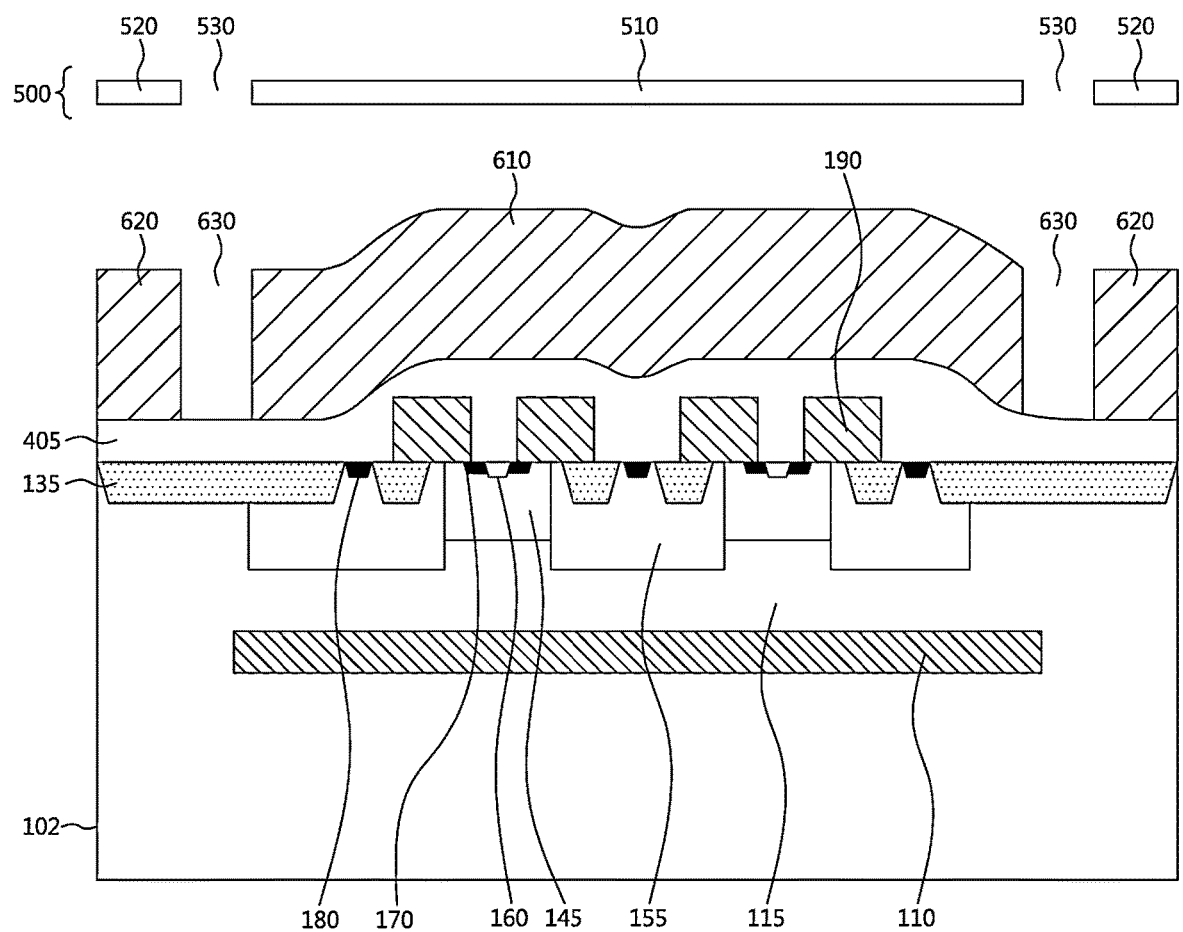

Referring to FIG. 5B, after performing a patterning process, two separated photoresist layers 610 and 620 may be formed to define the active regions 510 and 520. In other words, the photoresist layers 610 and 620 may be formed to have approximately the same geometries as the active regions 510 ad 520 shown in the revised layout of FIG. 2A, so that the photoresist layers 610 and 620 may be used in a later patterning process to accurately define the active regions 510 and 520. Additionally, an opening region 630 may be formed.

Figure 5C:
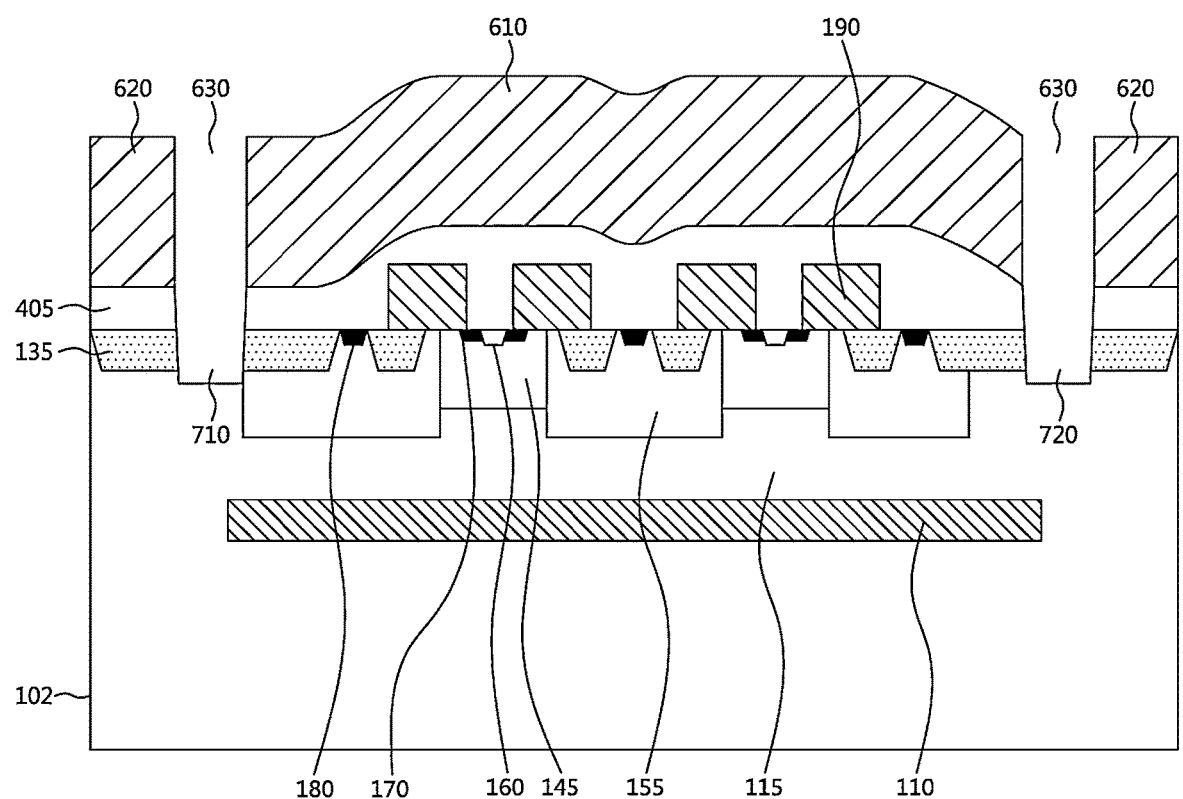

Referring to FIG. 5C, a reactive ion etching process may be performed to etch the insulating layer 405 and the STI 135 by using the photoresist layers 610 and 620 as a mask pattern. Therefore, a substrate 102 may be exposed after the reactive ion etching process. First and second deep trenches 710 and 720 may be formed in the substrate passing through the STI 135. The STI 135 may be divided into two portions due to the deep trench isolation 710 and 710.

Figure 5D:
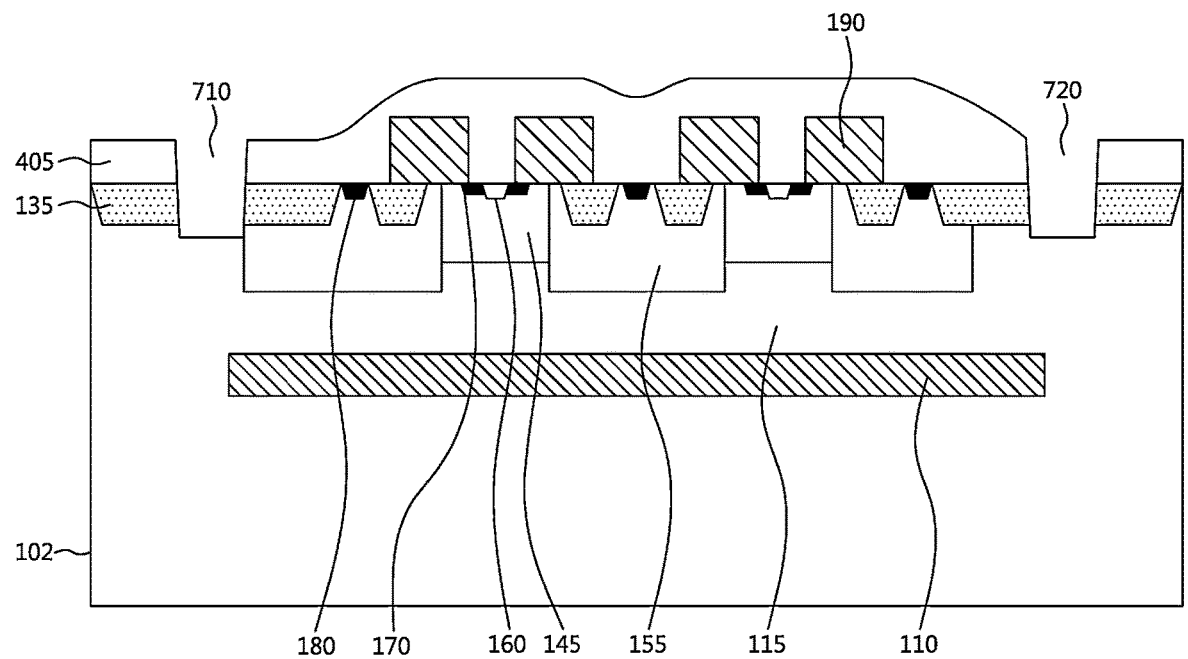

Referring to FIG. 5D, the photoresist layers 610, 620 may be removed. A substrate 102 may be continually etched by using an insulating layer 405 as a mask. When the insulating layer 405 is formed with a thin thickness, photoresist layers 610, 620 may not be removed, and the substrate 102 may be etched by using the photoresist layers 610, 620 and the insulating layer 405 as a mask.

Figure 5E:
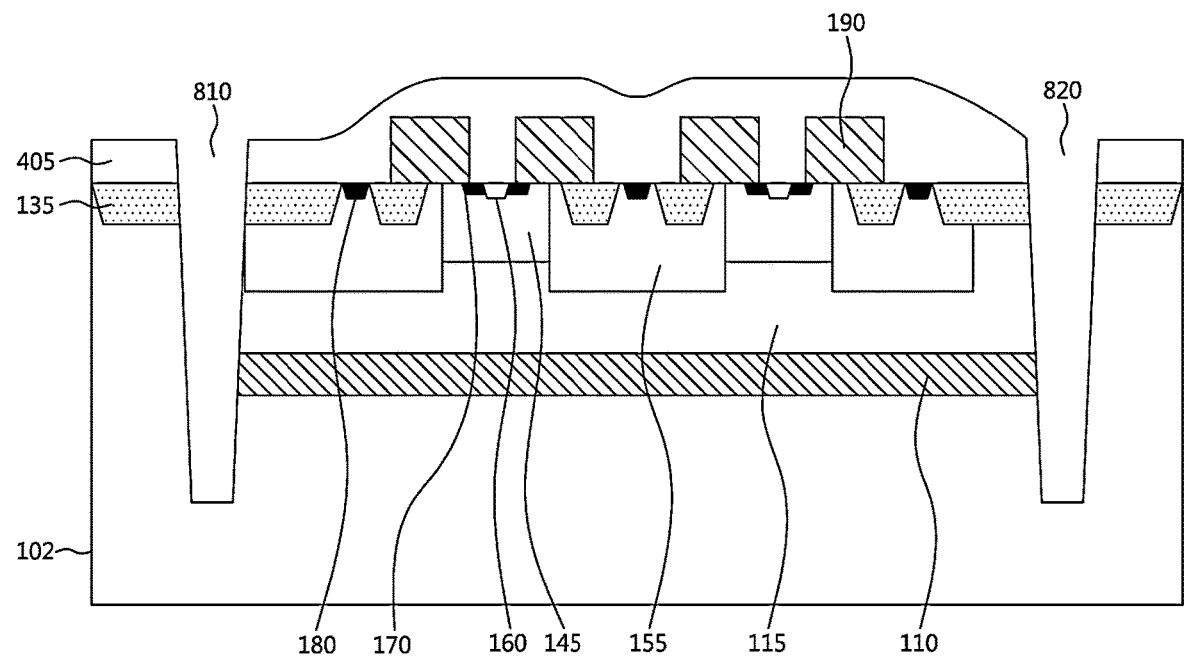

Referring to FIG. 5E, a DTI structure 810, 820 may be formed by continually etching a substrate using an insulating layer 405 as a mask. During the etching process, a thickness of an insulating layer 405 may become thinner. To protect a gate electrode 190, it may be desirable that the insulating layer 405 remain around the gate electrode 190 during the etching process.

Figure 5F:
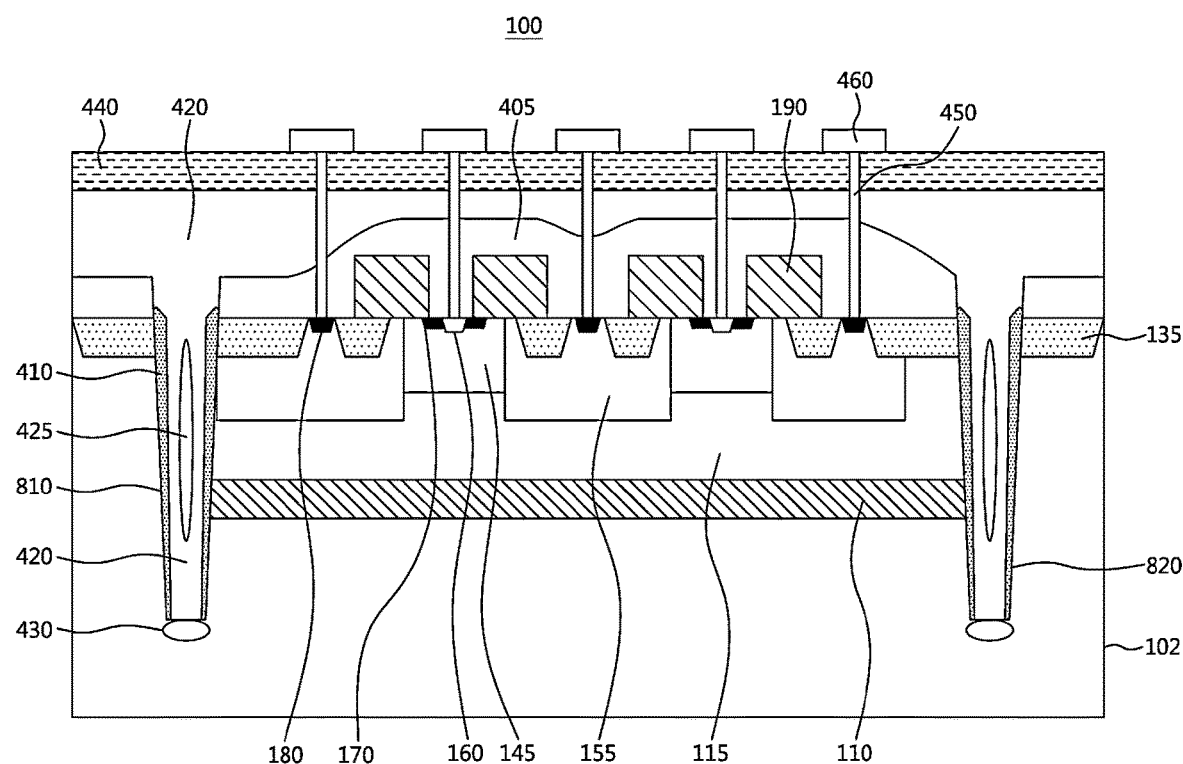

Referring to FIG. 5F, a channel stop region 430 may be formed under the deep trench 810, 820. The channel stop region 430 may be formed in a lower region of the deep trench 810, 820. A normal dopant that forms a channel stop region 430 may be a BF2 of P-type. A channel stop region 430 may be helpful to prevent a movement of a charge between adjoined or adjacent devices under a deep trench 810, 820. Therefore, a leakage current between devices may be reduced.

Referring again to FIG. 5F, a side wall insulating film 410 may be formed on sidewalls of the DTI 810, 820. The side wall insulating film 410 may be formed by implementing PE-TEOS. Further, a gap-fill insulating film 420 may be filled into the DTI 810, 820.

The gap-fill insulating film 420 may include a dielectric material such as, but not limited to, a silicon oxide, a silicon nitride, a silicon oxide-nitride, or a low-k material. When filling the deep trench 810, 820, PE-TEOS (Plasma Enhanced-Tetra Ethylene Ortho Silicate), BPSG (Boro-Phosphorous Silicate Glass), or HDP-FSG (High Destiny Plasma-Fluorinated Silicate Glass) etc. may be used, but is not limited thereto. In an example, the gap-fill insulating film 420 may be formed with BPSG.

In a filling process, a gap-fill insulating film 420 may include an air-space 425 disposed inside the DTI. The air-space 425 may be different from a void 750 (see FIG. 1D) that is an empty space formed near a trench corner. The air-space 425 may be a void formed in a gap-fill insulating film. A depth of the deep trench 810, 820 may be formed deeper than a first NBL (N-type Buried Layer) 110.

A semiconductor device illustrated in FIG. 5F may be polished by a polishing process (for example, but not limited to, a Chemical-Mechanical-Polishing process) to have a planarization surface, and an inter-layer insulating film 440 may be additionally formed on a gap-fill insulating film 420. After the CMP process, a plurality of contact plugs 450 and a metal wiring 460 may be formed. The plurality of contact plugs 450 may be electrically and respectively connected to a P+ pick up region 160, an N+ source region 170, and an N+ drain region 180 etc.

Figure 6:
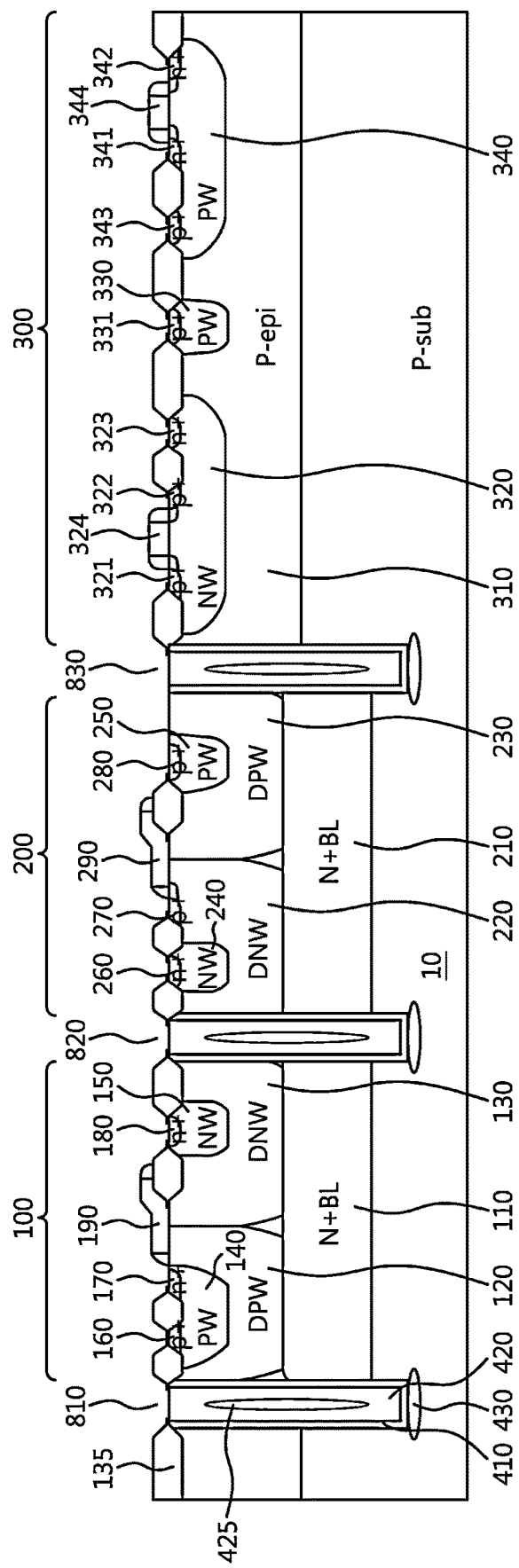
FIG. 6 illustrates an example semiconductor device where a deep trench region is formed, in accordance with one or more embodiments.

FIG. 6 illustrates an example semiconductor device where a deep trench region is formed, in accordance with one or more embodiments.

Referring to FIG. 6, an example semiconductor device where a deep trench region is formed may include a bipolar-CMOS-DMOS (hereafter, BCD). In an example, an N-type EDMOS 100, a P-type EDMOS 200 and a CMOS 300 may be included. In an example, the N-type EDMOS 100, the P-type EDMOS 200 and the CMOS 300 may be separated by implementing a plurality of deep trench (Deep Trench Isolation, DTI) 810, 820 and 830. An air-space 425 may be formed inside each of the DTI structures 810, 820 and 830. The N-type EDMOS 100, the P-type EDMOS 200 and the CMOS 300 may be formed in a P-type substrate 10. Additionally, instead of a STI, a LOCOS oxide layer 135 may be used as an isolation film with a shallow depth. A DTI structure may be formed through a LOCOS oxide layer 135.

The N-type EDMOS 100 may include a first NBL (N-type Buried Layer) 110, a DPW 120, a DNW 130, a first PW 140, a first NW 150, a P+ pick up region 160, an N+ source region 170, an N+ drain region 180, and a first gate electrode 190. In the one or more examples, a DPW 120 indicates a Deep P-type Well region (Deep P-type Well, in short, DPW). A DNW 130 indicates a deep NW well region (Deep N-type Well, in short, DNW). A PW 140 indicates a shallow P-type well region (shallow P-type Well, in short, PW). An NW 150 indicates a shallow N-type well region (Shallow N-type Well, in short, NW).

A first NBL 110 may be formed on a top surface of a P-type substrate 10. The DPW 120 and the DNW 130 may be formed on the first NBL 110. The first PW 140 may be formed in the DPW 120, and the P+ pick up region 160 and the N+ source region 170 may be formed in the first PW 140.

The P+ pick up region 160 and the N+ source region 170 may be formed to be spaced apart from each other through an isolation film. The first NW 150 may be formed in the DNW 130, and the N+ drain region 180 may be formed in the first NW 150. The first gate electrode 190 may be formed on a top surface of the DPW 120 and the DNW 130. Additionally, a spacer may be placed on opposite sides of a first gate electrode 190.

The P-type EDMOS 200 may include a second NBL (N-type Buried Layer) 210, a DNW 220, a DPW 230, a second NW 240, a second PW 250, an N+ pick up region 260, a P+ source region 270, a P+ drain region 280, and a second gate electrode 290.

The second NBL 210 may be formed on a top surface of the P-type substrate 10. The DNW 220 and the DPW 230 may be formed on the second NBL 210. The second NW 240 may be formed in the DNW 220. An N+ pick up region 260 may be formed in the second NW 240. The P+ source region 270 may be formed in the DNW 220. A second PW 250 may be formed in the DPW 230, and a P+ drain region 280 may be formed in the second PW 250. A second gate electrode 290 may be formed on a top surface of the DNW 220 and the DPW 230. Additionally, a spacer may be placed on opposite sides of a second gate electrode 290.

The CMOS 300 may be a CMOS (complementary metal-oxide semiconductor) CMOS. The CMOS 300 includes PMOSFET and NMOSFET respectively in a P-type epitaxial layer 310. PMOSFET includes a third NW 320, a P+ logic source region 321, a P+ logic drain region 322, an N+ pick up region 323 and a PMOS gate electrode 324. NMOSFET includes a fourth PW 340, a P+ pick up region 343, an N+ logic source region 341, an N+ logic drain region 342, and an NMOS gate electrode 344.

A deep trench 810, 820 may include a side wall insulating film 410 and a gap-fill insulating film 420 formed in a deep trench. A depth of a deep trench 810, 820 may be formed deeper than a first NBL (N-type Buried Layer) 110 and a second NBL (N-type Buried Layer) 210. Additionally, a channel stop region 430 may be additionally formed under a plurality of deep trenches 810, 820 and 830. A channel stop region 430 may be disposed in a lower part of the deep trenches 810, 820 and 830.

An isolation structure of a deep trench layout method for an example semiconductor device in accordance with one or more embodiments and a manufacturing method thereof may improve a gap-fill capability by removing a void that occurs in a trench corner.

Additionally, by reducing an amount of film used for a gap-fill, an operation time of Chemical Mechanical Polishing (CMP) may be shortened, and according to that, a thickness of an inter-layer insulating film may be equally formed.

Additionally, since a void is removed, a metal residue may be eliminated, therefore resulting in a secure semiconductor device.

While this disclosure includes specific examples, it will be apparent after an understanding of the disclosure of this application that various varies in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device fabrication method, the method comprising:
    preparing a substrate comprising at least a first active region and a second active region;
    forming a first conductivity type buried layer in the first active region, the buried layer comprising a first end and a second end;
    forming a shallow trench isolation (STI) structure on the substrate;
    forming a gate electrode on the first active region;
    forming an insulating layer on the gate electrode and the STI structure;
    forming a deep trench isolation (DTI) photoresist layer on the insulating layer;
    performing a patterning process on the DTI photoresist layer to form a first photoresist layer covering the first active region, a first opening, a second photoresist layer covering the second active region, and a second opening on the insulating layer, wherein the first opening and the second opening are aligned with the first end and the second end of the first conductivity type buried layer, respectively;
    performing a dry etching process on the insulating layer using the first and second photoresist layers as a mask pattern to form a first deep trench and a second deep trench that pass through the STI structure on the substrate, wherein the first deep trench and the second deep trench expose the first end and the second end of the first conductivity type buried layer, respectively;
    filling the first deep trench and the second deep trench with a gap-fill insulating film to form a DTI structure;
    performing a planarization process on the gap-fill insulating film to form a planarized gap-fill insulating film;
    forming an inter-layer insulating film on the planarized gap-fill insulating film; and
    forming contact plugs and metal wirings on the first active region,
    wherein the first photoresist layer covering the first active region has a rounded corner, and the second photoresist layer covering the second active region has a beveled corner facing the rounded corner of the first photoresist layer,
    wherein each of the first deep trench and the second deep trench has a rounded top trench corner and a beveled top trench corner, and
    wherein the gap-fill insulating film fills a space between the rounded top trench corner and the beveled top trench corner.

2. The method of claim 1, wherein the first active region has a rounded active corner and the second active region has a beveled active corner, and
    wherein the gap-fill insulating film fills the space between the first active region having the rounded active corner and the second active region having the beveled active corner.

3. The method of claim 1, wherein the gate electrode is configured to have a closed-loop form, and an active area is formed in an open area of the gate electrode.

4. The method of claim 2, wherein the gate electrode comprises a beveled gate corner having a same direction as a direction of the beveled active corner of the second active region.

5. The method of claim 2, wherein the beveled active corner of the second active region has a length greater than a length of the rounded active corner of the first active region.

6. A semiconductor device fabrication method, the method comprising:
preparing a substrate comprising a first active region and a second active region;
forming a first conductivity type buried layer in the first active region;
forming a shallow trench isolation (STI) structure on the first conductivity type buried layer;
forming a gate electrode on the first active region;
forming an insulating layer on the STI structure and the gate electrode;
forming a deep trench isolation (DTI) photoresist layer on the insulating layer;
performing a patterning process on the DTI photoresist layer to form a first photoresist layer covering the first active region, a first opening, a second photoresist layer covering the second active region, and a second opening on the insulating layer, wherein the first opening and the second opening are aligned with the first end and the second end of the first conductivity type buried layer, respectively;
performing an etching process on the insulating layer using the first and second photoresist layers as a mask pattern to form a first deep trench and a second deep trench that pass through the STI structure on the substrate, wherein the first deep trench and the second deep trench expose the first end and the second end of the first conductivity type buried layer, respectively;
forming a side wall insulating film in the first deep trench and the second deep trench;
filling the first deep trench and the second deep trench with a gap-fill insulating film to form a DTI structure;
performing a planarization process on the gap-fill insulating film to form a planarized gap-fill insulating film;
forming an inter-layer insulating film on the planarized gap-fill insulating film; and
forming contact plugs and metal wirings on the first active region,
wherein the first photoresist layer covering the first active region has a rounded corner, and the second photoresist layer covering the second active region has a beveled corner facing the rounded corner of the first photoresist layer,
wherein each of the first deep trench and the second deep trench has a rounded top trench corner and a beveled top trench corner, and
wherein the gap-fill insulating film fills a space between the rounded top trench corner and the beveled top trench corner.

7. The method of claim 6, wherein the first active region has a rounded active corner, and the second active region has a beveled active corner, and
wherein the gap-fill insulating film fills the space between the first active region having the rounded active corner and the second active region having the beveled active corner.

8. The method of claim 6, wherein the gate electrode has a closed loop shape and an open area.

9. The method of claim 8, further comprising:
forming a source region and a pick-up region in the open area; and
forming a drain region spaced apart from the gate electrode,
wherein the DTI structure is closer to the drain region than the source region and the pick-up region.

10. The method of claim 1, further comprising:
forming a first drift region, a first body region, a second drift region, a second body region and a third drift region on the first conductivity type buried layer, wherein each of the first and second body regions has a conductivity type opposite to the first through third drift regions;
forming a first drain region, a second drain region and a third drain region in the first, second and third drift regions, respectively; and
forming a first source region and a second source region in the first and second body regions, respectively,
wherein the first end of the first conductivity type buried layer is closer to the first drain region than the first source region, and
wherein the second end of the first conductivity type buried layer is closer to the third drain region than the second source region.

* * * * *